Figure 1:
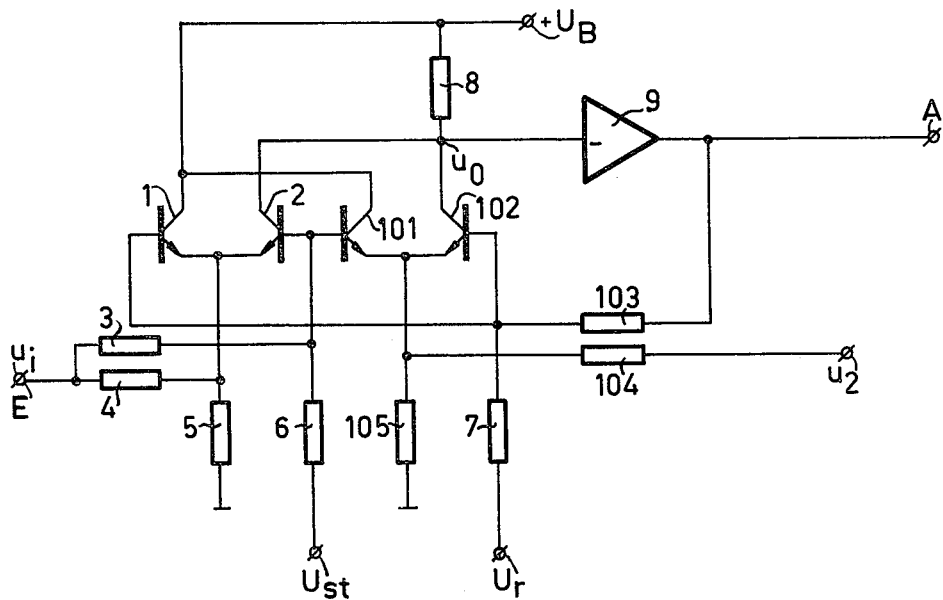

United States Patent [19]

Eckert et al.

[11] 4,435,685

[45] Mar. 6, 1984

[54] AMPLIFIER ARRANGEMENT

[75] Inventors: Wolfgang Eckert, Reinfeld; Bernd Holtkamp; Ernst A. Kilian, both of Hamburg, all of Fed. Rep. of Germany

[73] Assignee: U.S. Philips Corporation, New York, N.Y.

[21] Appl. No.: 255,921

[22] Filed: Apr. 20, 1981

[30] Foreign Application Priority Data

Jul. 12, 1980 [DE] Fed. Rep. of Germany ....... 3026551

[51] Int. Cl.³ .......................... H03F 3/45; H03F 1/26
[52] U.S. Cl. ................................. 330/261; 330/149; 330/252
[58] Field of Search ................ 330/149, 252, 254, 261

[56] References Cited

U.S. PATENT DOCUMENTS 3,825,854 7/1974 Pichal ................................. 330/149

FOREIGN PATENT DOCUMENTS 2291642 11/1974 France ................................ 330/254

Primary Examiner—James B. Mullins
Assistant Examiner—Gene Wan
Attorney, Agent, or Firm—Robert T. Mayer; Bernard Franzblau

[57] ABSTRACT

An amplifier comprising at least one emitter-coupled transistor pair with a signal source connected in the emitter line. Amplifier non-linearities mainly caused by the second harmonic are compensated by supplying the base of at least one of the transistors with a compensation signal of suitable phase that is derived from either the input or the output signal of the amplifier. This results in a multiplication process which produces a second harmonic in the collector current of the two transistors which, with the correct phase of the compensation signal at the input, exactly compensates the second harmonic caused by the amplifier non-linearity. If the transistor pair is used for gain or volume control, the direct voltage between the bases of the two transistors, and the compensation signal, will both be varied.

16 Claims, 3 Drawing Figures

AMPLIFIER ARRANGEMENT

The invention relates to an amplifier arrangement comprising at least one pair of transistors having their emitters connected to each other and to a signal source, the output signal being derived from the collector current of at least one transistor. Such amplifier arrangements are commonly known and are generally realised by integrated circuit technology. The output voltage mny then be smaller than the input voltage. Therefore, circuit arrangements whose gain is smaller than 1 are also referred to as amplifier arrangements hereinafter.

A drawback of such an amplifier arrangement is that the transistor pair, when operated as specified, gives rise to a comparatively high non-linear distortion. It is generally known that such distortion can be reduced by suitable negative feedback and it is furthermore known that in the case of a transistor pair which is operated as specified, the non-linear distortion can be reduced by employing transistors with a very low base and emitter-path resistance (DE-OS No. 24 18 455).

The invention is based on the recognition that non-linear distortion is mainly caused by the second harmonic (this is a wave having twice the frequency of the applied fundamental signal wave). Therefore, it is an object of the present invention to reduce the non-linear distortion in an amplifier arrangement of the type mentioned in the opening paragraph by reducing the second-harmonic content. According to the invention this problem is solved in that there is provided at least one compensation circuit which derives a compensation signal from the signal supplied by the signal source and/or the output signal. The compensation signal is applied to the base of at least one of the transistors of the pair and with a phase and such an amplitude such that the second harmonic of the signal wave in the output signal is at least partly compensated.

The effect of the invention is that the transistor pair represents a multiplying circuit which multiplies the signal applied to the emitter connection by the compensation signal supplied by the compensation circuit. Since the compensation signal has the same frequency as the signal applied to the emitter (and the same or opposite phase), the collector current of the two transistors also contains a component which represents the product of this multiplication and a squared sinewave, whose argument is the instantaneous value of the fundamental signal wave. Consequently, this component comprises an upper harmonic of twice the frequency of the fundamental wave, i.e. a second harmonic. If the amplitude and phase of the compensation signal applied to the base electrode are correct, the second harmonic obtained by said multiplication will at least partly compensate for the second harmonic caused by the non-linear characteristic of the amplifier.

The required magnitude and phase of the compensation signal depend on the circuit design and the transistors used. If the signal is supplied by a signal source which is so high-ohmic that the sum of the emitter currents is independent of the voltage between the bases of the transistors, the second harmonic is mainly produced by the base and the emitter-path resistance of the transistors. The second harmonics in the collector currents are then of opposite phase. They reach a minimum if the current supplied by the signal source is uniformly distributed between the two transistors or if one of the two transistors carries the entire current supplied by the signal source. This type of distortion can be compensated for by applying the compensation signal, with the same phase as that with which the signal supplied by the signal source appears on the emitters of the two transistors, to the base of the transistor carrying the greater part of the signal current or by applying said compensation signal with the opposite phase to the base of the transistor carrying the smaller part of the signal current. In either case the second harmonics in the collector currents of the two transistors can be reduced. This type of signal distortion becomes more pronounced as the emitter or the base-path resistance of the transistors of the pair increases or as the voltage drop produced across said resistance by the signal current increases.

However, even if said resistance or the voltage drop across it were zero, distortion could occur if the signal is not fed into the common emitter line of the transistor pair from a sufficiently high-ohmic signal source. In that case the emitter current will vary with the base bias of the two transistors, which results in a non-sinusoidal variation of the base-emitter voltage of the transistors, which again gives rise to second harmonics. The second harmonics in the collector currents are in the same phase. As a result of this, a signal applied to the base of the one transistor in phase with the signal applied to the emitter reduces the second harmonic in the collector current of this transistor, but causes the second harmonic in the collector current of the other transistor to increase. The output signal can then be derived only from the collector current of the one transistor. The maximum distortion factor then occurs when said transistor carries approximately 50 to 75% of the signal current supplied to the emitters. Generally this second effect preponderates over the first-mentioned effect, especially at high signal amplitudes.

An additional effect in the case of integrated circuits is that second harmonics may be produced by integrated resistors. Their magnitude and phase depend on the values and the arrangement of said resistors in the circuit and on the amplitude of the signal voltage. Their influence—if it is disturbing at all—can only be determined empirically by varying the amplitude of the signals applied to the base and/or the phase (either the same as or opposite to the phase of the input signal) and determining at which setting the distortion is minimal.

As a rule the transistor pairs of the type mentioned in the opening paragraph are employed for varying the gain of an amplifier arrangement depending on a direct voltage. This variable d.c. control voltage is applied between the bases of the transistors of the pair so that the distribution of the current among the two transistors of the pair, and thus the gain of the circuit arrangement, varies. However, at the same time the amplitude of the second harmonics caused by the non-linearity also varies so that a compensation voltage of a specific phase and amplitude, which is optimized in order to reduce the second harmonics for a specific d.c. control voltage, no longer has an optimum effect for a different d.c. control voltage. In a further embodiment of the invention the compensation signal is applied to the base of that transistor of the pair from whose collector current the output signal is derived, with the same phase, and/or to the base of the other transistor of the pair with the opposite phase relative to the signal on the common emitter connection of the pair.

In the case of a suitable arrangement of a direct voltage converter and the compensation circuit it is then possible to reduce the second harmonics independently of the magnitude of the d.c. control voltage.

For example, from DE-OS No. 27 55 827 circuit arrangements are known which include two cross-coupled transistor pairs, each of the four transistors having one—and only one—electrode in common with any other transistor. In a suitable further embodiment of the invention the signal is applied to the common emitter connection of the transistors of the further pair in phase opposition relative to the common emitter connection of the transistors of the other pair. This ensures that the compensation signal can act to reduce the second harmonics for both transistor pairs.

Figure 3:
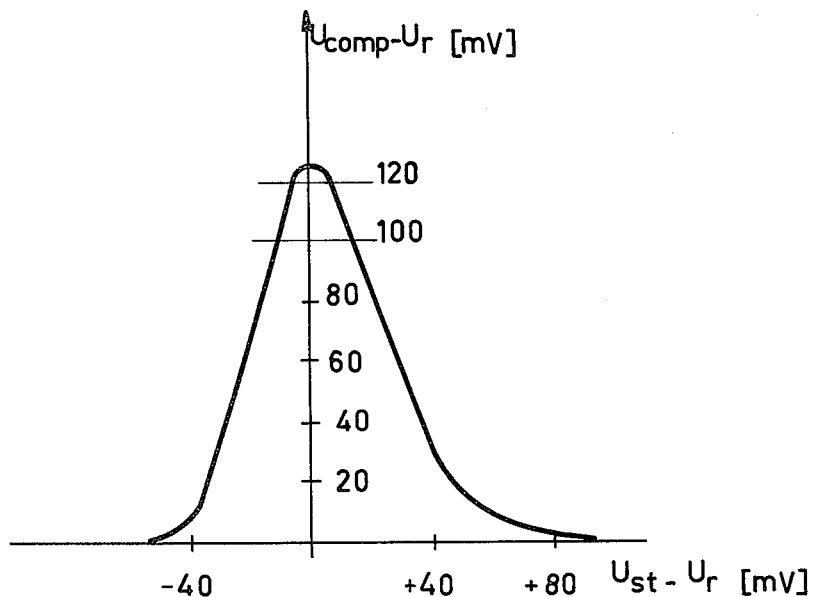
Figure 2:
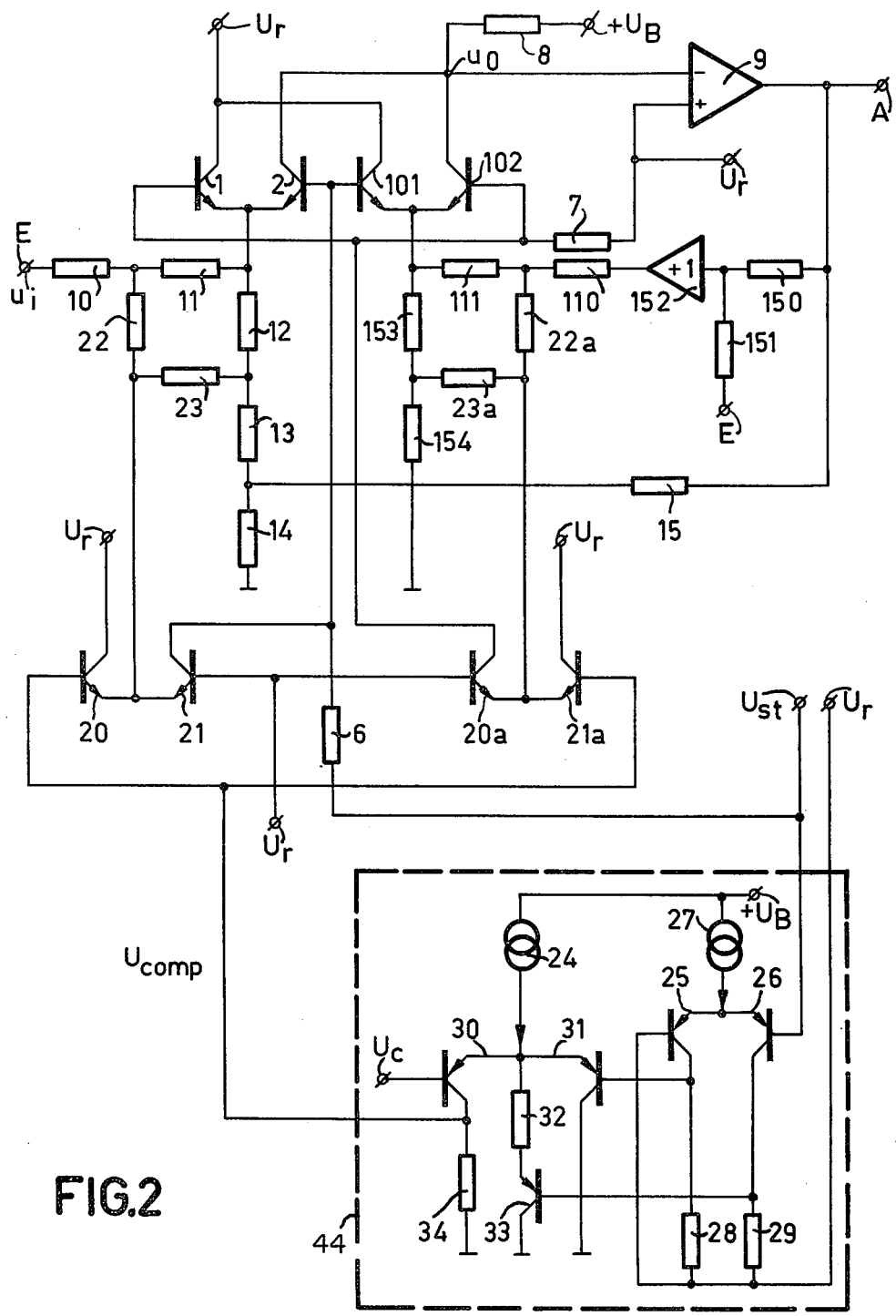

The invention will now be described in more detail with reference to the drawing, which shows an embodiment given by way of example. In the drawing:

FIG. 1 is a basic circuit diagram of the circuit arrangement in accordance with the invention, FIG. 2 shows the circuit arrangement in detail, and FIG. 3 is the characteristic of the direct voltage converter included in the circuit arrangement of FIG. 2.

The circuit arrangement of FIG. 1 comprises two cross-coupled pairs of transistors 1, 2 and 101, 102, that is the collector of transistor 1 is connected to the collector of transistor 101 and the collector of transistor 2 to the collector of transistor 102. The base of the transistor 1 is connected to the base of transistor 102 and the base of the transistor 2 is connected to the base of the transistor 101. The collectors of the transistors 1 and 101 are connected to a positive supply voltage $+U_B$ and the collectors of transistors 2 and 102 are connected to $+U_B$ via the output resistor 8. The common emitter lines of the transistors 1, 2 and 101, 102 respectively include resistors 5 and 105. The input signal $u_i$ is applied to the commoned emitters of the transistors 1 and 2 via a resistor 4. Via a resistor 104 the emitters of the transistors 101 and 102 receive a voltage $u_2$ which is in phase opposition to the voltage $u_i$ and which may, for example, be derived from the output voltage $u_0$ (at the junction point of the collectors of the transistors 2 and 102) via an inverter stage 9.

For the compensation of second harmonics the base of the transistors 2 and 101 is connected to the tapping of a voltage divider comprising the resistors 3 and 6, the other end of the resistor 3 being connected to the input terminal E and the other end of the resistor 6 to a low-ohmic voltage source, which supplies a variable direct voltage $U_{st}$. A voltage divider comprising the resistors 7 and 103, having a tapping connected to the commoned bases of the transistors 1 and 102, operates in the same way. The other end of the resistor 103 is connected to an output A of the amplifier circuit or to the output of an inverter circuit 9 whose input receives the voltage $u_0$ across the output resistor 8. The other end of the resistor 7 is connected to a low-ohmic voltage source which supplies a constant direct voltage $U_r$, which for example corresponds to half the supply voltage $U_B$.

Although the compensation signals at the tappings of the voltage dividers 3, 6 and 103, 7 are in phase opposition, the second harmonics at the junction point of the collectors of the transistors 2 and 102, which are produced as a result of the multiplication by the input signals in the emitter circuits, will be in phase because the tappings are connected to different base connections. Moreover, the compensation signals at the bases of the transistors 1 and 2, relative to the signal at the emitters of these transistors, have the same phase as the compensation signals at the bases of the transistors 101 and 102 relative to the signal at the emitters of these transistors.

When the voltage dividers 3, 6 and 103, 7 are suitably dimensioned, the harmonics caused by non-linearities of the circuit are compensated for by second harmonics obtained by means of the compensation signals. In principle, only one of the two voltage dividers would be required for compensation. If the output signal $u_0$ or the signal at the output A is large in comparision with the input signal $u_i$, the voltage divider 3, 6 may be dispensed with and, in the opposite case, the voltage divider 103, 7.

In principle, the compensation-signal amplitude necessary for a correct compensation, apart from depending on the input and the output voltage (this dependence is allowed for by the voltage divider because the compensation voltage taken from this divider increases with the input and output amplitude respectively), also depends on the current distribution of the two cross-coupled transistor pairs, which is determined by the difference $u_{st}-U_r$ of the direct voltage on the bases of the transistors 1, 2 and 101, 102 respectively. Thus, if the d.c. control voltage $U_{st}$ is changed, the voltage divider ratio or the part of the input or output voltage coupled to the bases should also be varied in order to ensure an exact compensation.

FIG. 2 shows an amplifier arrangement suitable for this purpose.

The arrangement again comprises two cross-coupled pairs of transistors 1, 2 and 101, 102. The input terminal E, to which the input signal $u_i$ is applied, is connected to the command emitters of the transistors 1 and 2 via the series connection of two resistors 10 and 11. The junction point of these emitters is connected to ground via the series connection of three resistors 12, 13 and 14. The junction point of the resistors 13 and 14 is connected to the output A of the amplifier arrangement via a resistor 15, which output also constitutes the output of the inverting amplifier 9. The second pair of transistors 101 ad 102 receives a signal via a series connection of a resistor 110 and a resistor 111. This signal is supplied by a voltage follower 152 (gain +1) whose input is connected to the output A of the amplifier arrangement via a 2 kohm resistor 150 and to the input E of the amplifier arrangement via a resistor 151.

Moreover, the emitter line of the transistors 101 and 102 is connected to earth via the series connection of two resistors 153, of 1 kohm, and 154, of 7.2 kohms. The compensation signals on the bases of transistors 1, 2, 101, 102 are produced by two transistor pairs 20, 21 and 20a, 21a, which are of the same conductivity type (npn) as the transistors 1, 2, 101, 102. The emitters of the transistors 20 and 21 are commoned and so are the emitters of the transistors 20a and 21a. Via the resistors 22 and 22a respectively the emitter connections are connected to the junction points of the resistors 10, 11 and 110, 111 respectively, and via the resistors 23 and 23a respectively to the junction point of the resistors 12, 13 and 153, 154 respectively. The resistors 22 ... 23a have equal values. The collectors of the transistors 21 and 20a are connected to the bases of the transistors 2, 101 and 1, 102 respectively. The base electrodes of the transistors 21 and 20a are connected to the fixed direct voltage $U_r$. The base electrodes of the transistors 20 and 21a are also connected to each other and to the output of a direct voltage converter 44. The converter output voltage $U_{comp}$ depends on the variable direct voltage $U_{st}-U_r$ which is applied between the bases of the transistors 2, 101 and 1, 102 respectively.

FIG. 3 represents the magnitude of the output voltage $U_{comp}$ of the d.c. converter 44 (minus the fixed reference voltage $U_r$) as a function of the input voltage $U_{st}-U_r$. It can be seen that the output voltage $U_{comp}$ has its maximum when the d.c. control voltage $U_{st}-U_r$ is approximately zero and that it assumes the value zero if the control voltage $U_{st}-U_r$—regardless of its polarity—has a sufficiently high value.

If the adjusted direct voltage $U_{st}$ is 100 mV (or more) more positive than the direct voltage $U_r$, transistors 2 and 101 are conductive and the output signal $u_0$ on the junction point of the collectors of the transistors 2 and 102 is almost exclusively supplied by the collector current of the transistor 2. The gain of the amplifier circuit then is a maximum (greater than 1) because the feedback via the inverting amplifier 9 and the resistor 15 is then still comparatively small. The output voltage $U_{comp}$ then corresponds approximately to the fixed direct voltage $U_r$, so that the transistors 21 and 20a then carry approximately half the signal current, which is derived from the input or output on the emitters of the pairs 20, 21 and 20a, 21a respectively. The compensation signal on the collector of the transistor 20a is then substantially greater than the compensation signal supplied by the transistor 21 because the output signal, from which the emitter signal of the transistor 20a is derived, is greater than the input signal, from which the emitter signal of the transistor 21 is derived. If practically the total current flows through the transistors 2 and 101, the comparatively small compensation signal hardly influences the current distribution and thus the output signal $u_0$, i.e. it produces hardly any second harmonics which can compensate for the second harmonics as a result of non-linearities. However, this has hardly any adverse effect because the non-linear distortion in this operating condition is comparatively low.

When the voltage $U_{st}$ is substantially equal to the voltage $U_r$ the emitter currents are distributed substantially uniformly among the transistors 1, 2 and 101, 102 respectively. Because of the stronger negative feedback of the second transistor pair, the overall gain is smaller (approximately 1). The output voltage $U_{comp}$ is then approximately 120 mV more positive than the direct voltage $U_r$ so that the transistors 21 and 20a only carry a fraction of the signal current applied to the emitters of the transistor pairs 20, 21 and 20a, 21a respectively. For this average setting the second harmonics caused by non-linear distortion are minimal. Therefore, the compensation signals should also be small in this case. The voltages at the terminals E and A are then of the same order of magnitude so that the (small) compensation signals supplied by the transistors 21 and 20a equally contribute to the compensation of harmonics.

If the voltage $U_{st}$ is 100 mV (or more) more negative than the fixed direct voltage $U_r$, transistors 2 and 101 are substantially cut off and transistors 1 and 102 conductive. The overall gain is then substantially smaller than 1 so that the input voltage is higher than the voltage at output A, as a result of which the compensation signal supplied by the transistor 21 is substantially greater than the compensation signal supplied by the transistor 20a. The voltage $U_{comp}$ is then again approximately equal to the fixed voltage $U_r$ so that it corresponds to half the (signal) current applied to the emitters of transistor pairs 20, 21 and 20a, 21a via the transistors 21 and 20a respectively.

As explained in the foregoing, it is not the exact magnitude of the compensation signal or the direct voltage $U_{comp}$ which is essential at the "maximum settings", that is when almost the total current flows either via the transistors 2, 101 or via the transistors 1, 102. However, in the range in which approximately 70% of the current at the junction point of the emitters flows via the transistors 2 or 101 the voltage $U_{comp}$ should not deviate significantly from the value which is found to be the optimum value.

The circuit arrangement of the d.c. converter 44 will now be described. The transistors used in the d.c. converter are of a conductivity type (pnp) which is the opposite of that of the transistors of the cross-coupled pair and of the compensation circuit. Two transistors 25 and 26 are connected to each other with their emitters and to the positive supply voltage terminal $+U_B$ via a direct current source 27. Their collector lines include two resistors 28, 29 of equal value. The base of the transistor 25 is connected to the fixed direct voltage $U_r$ and the base of transistor 26 to the variable direct voltage $U_{st}$. The circuit further comprises two transistors 30 and 31 whose emitters are commoned. This junction point is connected to the emitter of a further transistor 33 via a resistor 32 and to the positive direct voltage terminal $+U_B$ via a direct current source 24 supplying a current that is 1.5 times that of the direct current source 27. The collectors of the transistors 31 and 33 are connected to ground, while the collector of transistor 30 is connected to ground via a resistor 34. The base of the transistor 31 is connected to the collector of the transistor 25 and the base of transistor 33 is connected to the collector of the transistor 26. The base of the transistor 30 receives a temperature independent direct voltage $U_c$ which is proportioned so that the transistor 30 carries two thirds of the current supplied by the direct current source 24 when the voltages $U_{st}$ and $U_r$ are equal to each other.

The resistor 34 is now dimensioned so that the voltage drop then produced across it is approximately 120 mV. If the voltage $U_{st}$ is higher or lower than the voltage $U_r$, the voltage drop across resistor 29 or across resistor 28 decreases, that is the base potential of the transistors 31 and 33 increases so that the portion of the direct current supplied by the direct current source 24 flowing via one of these two transistors increases, as a result of which the direct current through the transistor 30 and thus the voltage drop across the resistor 34 decreases. The resistor 32 in the emitter line of the transistor 33 may then give rise to an asymmetry, as is apparent from FIG. 3.

The output voltage $U_{comp}$ generated by means of the dc converter 44 as a function of the input voltage $U_{st}-U_r$ (see FIG. 3) can be adapted to specific requirements within wide limits.

The maximum value can, for example, be increased or reduced in that the current of the current source 24 and/or the value of the resistor 34 is increased or reduced. The width of the curve can be reduced or increased in that either the current from the current souce 27 is reduced or increased or that resistors 28, 29 of a smaller or greater value are used, or in that the bias voltage $U_c$ is made more positive (negative). An even more pronounced asymmetry can be obtained by increasing the value of resistor 32. A mirror-inverted asymmetrical shape of the curve (relative to the vertical $U_{st}=U_r$) is obtained by including the resistor 32 in the emitter line of the transistor 31 or by interchanging the base connections of the transistors 31 and 33.

What is claimed is:

1. An amplifier arrangement comprising at least one pair of transistors having their emitters connected to each other and to a signal source that supplies an input signal to said interconnected emitters, an output signal being derived from the collector current of at least one transistor, at least one compensation circuit which derives a compensation signal from at least one of the two signals comprising the input signal supplied by the signal source and the output signal, and means for applying the compensation signal to the base of at least one of the transistors of the pair and with a phase and an amplitude such that the second harmonic of the signal wave in the output signal is at least partly compensated.

2. An amplifier arrangement as claimed in claim 1, wherein the compensation signal is applied with the same phase as the input signal at the interconnected emitters of the transistors to the base of the transistor of the pair of transistors from whose collector current the output signal is derived.

3. An amplifier arrangement as claimed in claim 1 further comprising a d.c. converter having an input and an output, a source of variable d.c. control voltage applied to said d.c. converter input and between the bases of the transistors of the pair of transistors, wherein the compensation circuit includes a control input for controlling its transmission factor by means of a direct voltage, means coupling the control input to the output of the d.c. converter which converts said d.c. control voltage applied to its input into a direct voltage of a magnitude such that for any d.c. control voltage the second harmonic is reduced by the compensation signal.

4. An amplifier arrangement as claimed in claim 3 wherein the compensation circuit comprises two transistors having their emitters connected in common, means connecting the collector of one transistor to a base electrode of one of the transistors of the pair of transistors, and means coupling a base electrode of at least one of the two transistors of the compensation circuit to said control input so that said base electrode is supplied with a direct voltage by the d.c. converter.

5. An amplifier arrangement as claimed in claim 3, wherein the d.c. converter is designed to supply a maximum output voltage when the d.c. control voltage is zero, and the compensation circuit comprises two further transistors having their emitters connected in common, means connecting the collector of one said further transistor to a base electrode of one of the transistors of the pair of transistors, and means coupling a base electrode of the other one of said two further transistors to said compensation circuit control input so that said base electrode is supplied with a direct voltage from the output of the d.c. converter.

6. An amplifier arrangement as claimed in claim 1, wherein the compensation signal is applied to the base of the other transistor of the pair of transistors and with opposite phase to that of the input signal at the interconnected emitters of the transistors.

7. An amplifier arrangement as claimed in claim 1, wherein the compensation signal is applied with the same phase as that of the input signal at the interconnected emitters of the transistors to the base of said one transistor of the pair of transistors from whose collector current the output signal is derived, the compensation signal also being applied to the base of the other transistor of the pair of transistors with opposite phase to that of the input signal at the interconnected emitters.

8. An amplifier arrangement as claimed in any one of the preceding claims, comprising a further pair of transistors having their emitters connected in common and being connected to the one transistor pair so that the base electrodes of the one pair of transistors are individually connected to base electrodes of corresponding transistors of the further pair of transistors and the collector electrodes of the one pair of transistors are individually connected to collector electrodes of corresponding transistors of the further pair of transistors, a signal being applied to the common emitter connection of the further pair of transistors in phase opposition to that of the signal which is applied to the common emitter connection of the one pair of transistors.

9. An amplifier arrangement as claimed in claims 1, 2, or 6 further comprising, a source of variable d.c. control voltage coupled between the bases of the pair of transistors, and a d.c. converter having an output coupled to a control input of the compensation circuit so as to control the transmission factor of the compensation circuit by means of a direct voltage, said d.c. converter having an input coupled to a source of d.c. control voltage and means for converting the d.c. control voltage into a direct voltage at its output of a magnitude such that for any d.c. control voltage the second harmonic of the amplifier output signal is reduced by said compensation signal.

10. An amplifier comprising a pair of first and second transistors having emitter electrodes connected in common to an input terminal adapted for connection to a source of input signal, and output terminal coupled to a collector electrode of the second transistor for deriving an output signal from the collector current of the second transistor, and a compensation circuit coupling said input terminal to a base electrode of the second transistor so as to derive a compensation signal at said base electrode that is in phase with an input signal applied to said interconnected emitter electrodes whereby said pair of transistors effectively operate to multiply the input signal at the interconnected emitter electrodes with said compensation signal thereby to at least partly compensate any second harmonic component of the output signal at the output terminal.

11. An amplifier as claimed in claim 10 further comprising a second pair of third and fourth transistors having emitter electrodes connected in common to a signal source which is in phase opposition to the input signal, means for cross-coupling said first and second pairs of transistors so that the collectors of the first and third and second and fourth transistors are respectively coupled together and the bases of the second and third and first and fourth transistors are respectively coupled together, and wherein said compensation circuit couples a compensation signal to the bases of the first and fourth transistors that is in phase opposition to said compensation signal at the base of the second transistor.

12. An amplifier as claimed in claims 10 or 11 wherein said compensation circuit includes a first voltage divider coupled between said input terminal and a source of variable direct voltage with a tapping on the first voltage divider connected to the base of the second transistor and a second voltage divider coupled between said output terminal and a source of direct voltage with a tapping on the second voltage divider connected to the base of the first transistor.

13. An amplifier comprising a pair of first and second transistors having emitter electrodes connected in common to an input terminal adapted for connection to a source of input signal, an output terminal coupled to a collector electrode of the second transistor for deriving an output signal from the collector current of the second transistor, and a compensation circuit coupling said output terminal to a base electrode of the first transistor so as to derive a compensation signal at said base electrode that is in phase opposition with an input signal applied to said interconnected emitter electrodes whereby said pair of transistors effectively operate to multiply the input signal at the interconnected emitter electrodes with said compensation signal thereby to at least partly compensate any second harmonic component of the output signal appearing at the output terminal.

14. An amplifier as claimed in claim 13 further comprising a second pair of third and fourth transistors having emitter electrodes connected in common to a signal source which is in phase opposition to the input signal, means for cross-coupling said first and second pairs of transistors so that the collectors of the first and third and second and fourth transistors are respectively coupled together and the bases of the second and third and first and fourth transistors are respectively coupled together, and wherein said compensation circuit couples the input terminal to the bases of the second and third transistors to derive a compensation signal at the bases of the second and third transistors that is in phase opposition to said compensation signal at the base of the first transistor.

15. An amplifier as claimed in claims 10, 11, 13 or 14 including a source of variable d.c. voltage coupled at least to the base electrode of the second transistor, and a d.c. converter having an output coupled to a control input of the compensation circuit so as to control the transmission factor of the compensation circuit, said d.c. converter having an input coupled to a source of d.c. control voltage and means for converting the d.c. control voltage into a direct voltage at its output of a magnitude such that for any d.c. control voltage the second harmonic of the amplifier output signal is reduced by said compensation signal.

16. An amplifier as claimed in claims 10 or 13 wherein the compensation circuit comprises two further transistors having their emitters connected together in common, means connecting a collector of one of said two further transistors to a base electrode of one of said first and second transistors, means coupling a base electrode of the other one of said two further transistors to a control input of the compensation circuit, and a d.c. converter having an output coupled to the control input of the compensation circuit so as to control the transmission factor of the compensation circuit, said d.c. converter having an input coupled to a source of d.c. control voltage and means for converting the d.c. control voltage into a direct voltage at its output of a magnitude such that for any d.c. control voltage the second harmonic of the amplifier output signal is reduced by said compensation signal.

* * * * *